United States Patent [19]
Shibuya et al.

[11] Patent Number: 5,851,707
[45] Date of Patent: Dec. 22, 1998

[54] MICROLITHOGRAPHY PROJECTION-EXPOSURE MASKS, AND METHODS AND APPARATUS EMPLOYING SAME

[75] Inventors: Masato Shibuya, Ohmiya; Hiroshi Ooki; Kazuya Okamoto, both of Yokohama; Soichi Owa, Tokyo, all of Japan

[73] Assignee: Nikon Corporation, Tokyo, Japan

[21] Appl. No.: 899,909

[22] Filed: Jul. 24, 1997

[30] Foreign Application Priority Data

Jul. 24, 1996 [JP] Japan ................................. 8-213131

[51] Int. Cl.⁶ ....................................................... G03F 9/00
[52] U.S. Cl. ................................................ 430/5; 430/394
[58] Field of Search ................................ 430/5, 322, 394

[56] References Cited

U.S. PATENT DOCUMENTS 5,532,090  7/1996  Borodovsky ................................. 430/5

FOREIGN PATENT DOCUMENTS

07326561 A  12/1995  Japan .

Primary Examiner—S. Rosasco
Attorney, Agent, or Firm—Klarquist Sparkman Campbell Leigh & Whinston, LLP

[57] ABSTRACT

Methods and apparatus are disclosed for microlithographically exposing a photosensitive substrate comprising single-exposure areas and multiple-exposure areas. After exposing the substrate, line widths in the single-exposure areas are substantially the same as line widths in the multiple-exposure areas. Also disclosed are masks comprising a first mask pattern used to expose the single-exposure areas once and a plurality of other mask patterns for exposing the multiple-exposure areas a predetermined number of times. Each of the other mask patterns allows a lower intensity of illumination light flux to be distributed to the multiple-exposure areas per exposure of the substrate than allowed by the first mask pattern. Consequently, the average intensity of illumination-light flux distributed to the single-exposure area after one exposure is substantially equal to the average intensity of illumination-light flux distributed to the multiple-exposure areas after a predetermined number of exposures of such areas.

15 Claims, 3 Drawing Sheets

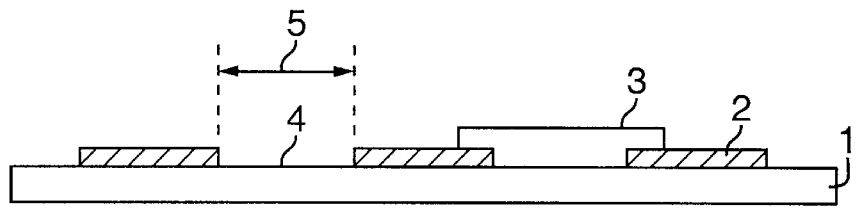
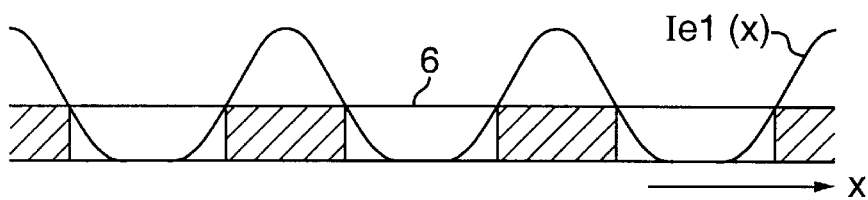
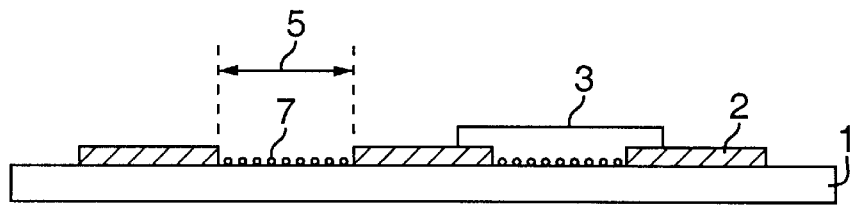
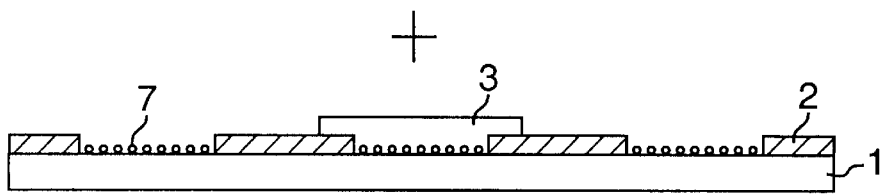
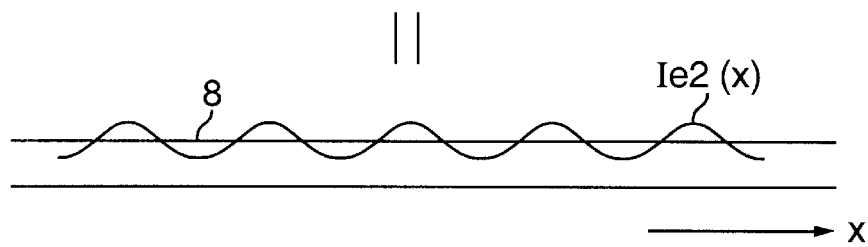

MICROLITHOGRAPHY PROJECTION-EXPOSURE MASKS, AND METHODS AND APPARATUS EMPLOYING SAME

FIELD OF THE INVENTION

This invention concerns microlithography exposure methods and apparatus and particularly exposure methods and apparatus used in the manufacture of semiconductor devices and liquid crystal displays.

BACKGROUND OF THE INVENTION

Conventional microlithographic exposure methods and apparatus, such as "aligners," containing projecting optical systems have not been able to project fine patterns onto a photosensitive material (i.e., resist) with a resolution that exceeds the resolution limit of the projecting optical system. More recently, however, Japanese patent application 6-291009 discloses using non-linear multiple exposures to exceed the resolution limit of the projecting optical system. Specifically, a photosensitive material is used that responds non-linearly to the intensity of the incident light. The photosensitive material is coated on a suitable substrate. Multiple exposures are performed on the photosensitive material while altering the light intensity distribution on the resist. By altering the light intensity distribution, fine patterns exceeding the resolution limit of the projecting optical system have been achieved. The light intensity distribution is altered by changing the position of the mask pattern in response to the projecting optical system, changing the mask pattern itself or altering the position of the resist-coated substrate.

Typically, some areas of the photosensitive material are exposed using this multiple-exposure technique, while other areas where finer resolution is not required are only exposed once. For this reason, the average effective intensity of a multiple-exposure area (average level of illumination) and the average effective intensity of a single-exposure area are different. As a result, a line width of a pattern formed in a multiple-exposure area differs from a line width formed in a single-exposure area.

SUMMARY OF THE INVENTION

In view of the foregoing shortcomings of the prior art, an object of the invention is to provide exposure apparatus and methods that can create fine patterns exceeding the resolution limit of the projecting optical system. A further object of the present invention is to provide such apparatus and methods wherein a line width of a pattern formed in a multiple-exposure area of a photosensitive material is substantially equivalent to a line width formed in a single-exposure area.

The foregoing objects are attained by an exposure device, according to one aspect of the present invention, that comprises a first mask pattern for exposing single-exposure areas and a plurality of mask patterns for exposing multiple-exposure areas of the photosensitive material. Each of the mask patterns used to expose the multiple-exposure areas restrict a greater amount of light-flux intensity per exposure than the first mask pattern. The degree of restriction is chosen so that the average light-flux intensity distributed to the single-exposure areas after one exposure is substantially equivalent to the average light-flux intensity distributed to the multiple-exposure areas after multiple exposures. Accordingly, the line widths in the single- and multiple-exposure areas are essentially the same even though the two areas are exposed a different number of times.

According to another aspect of the invention, the mask patterns include masking sections and light-permeable sections. The masking sections block light from a light source, whereas the light-permeable sections preferably comprise apertures extending between adjacent masking sections and allow light to be distributed to the photosensitive material. In a first type of mask pattern (used to distribute light to the single-exposure area) the apertures extend continuously between masking sections. In a second type of mask pattern (used to distribute light to a multiple-exposure area), spaced-apart light-impermeable sections are positioned within the apertures to further restrict the amount of light per exposure that is distributed to the photosensitive material. Accordingly, the light-flux intensity varies depending on which mask pattern is used. The degree of restriction created by the light-impermeable sections is chosen so that the average light-flux intensity distributed to the single- and multiple-exposure areas is the same even though the two areas are exposed a different number of times.

According to yet another aspect of the invention, the width of a light-permeable section in the first type of mask pattern is greater than the width of a light-permeable section in the second type of mask pattern. The result is that the light-flux intensity per exposure distributed through the first type of mask pattern is greater than the light-flux intensity distributed through the second type of mask pattern. The widths of the light-permeable sections of the second type of mask patterns are chosen so that the average light-flux intensity distributed to the single-exposure area (after one exposure) substantially equals the light-flux intensity distributed to the multiple-exposure area (after multiple exposures). This results in the line widths in both areas to be essentially the same.

According to a fourth aspect of the invention, the widths of the light-permeable sections in the mask patterns are substantially the same, but the masking sections in the first mask pattern are, to a limited extent, configured to be light permeable, while the masking sections in the other mask patterns are comparatively light-impermeable. The result is that the light-flux intensity distributed by a first type of mask pattern is greater per exposure than the light-flux intensity distributed by the second type of mask pattern. The degree of light permeability of the masking sections is chosen so that the average light-flux intensity distributed to the single-exposure areas (after one exposure) substantially equals the average light-flux intensity distributed to the multiple-exposure areas (after multiple exposures).

The foregoing and additional features and advantages of the invention will be more readily apparent from the following detailed description, which proceeds with reference to the accompanying drawings.

BRIEF DESCRIPTION OF DRAWINGS

FIG. 1(*a*) shows a mask pattern, according to one aspect of the invention, for projection-distributing an intensity of illumination-light flux to a single-exposure area of a photosensitive substrate.

FIG. 1(*a'*) shows the intensity of illumination-light flux distributed to the photosensitive substrate by the mask pattern of FIG. 1(*a*).

FIG. 1(*b*) shows a mask pattern for projection-distributing an intensity of illumination-light flux in a first exposure of a multiple-exposure area of the photosensitive substrate.

FIG. 1(*b'*) shows the intensity of illumination-light flux distributed to the photosensitive substrate using the mask pattern of FIG. 1(*b*).

FIG. 1(c) shows a mask pattern for projection-distributing an intensity of illumination-light flux in a second exposure of a multiple-exposure area of the photosensitive substrate.

FIG. 1(c') shows the intensity of illumination-light flux distributed to the photosensitive substrate using the mask pattern of FIG. 1(c).

FIG. 1(d') shows a combined intensity of illumination-light flux on the multiple-exposure area resulting from multiple exposures using the mask patterns of FIGS. 1(b) and 1(c).

DETAILED DESCRIPTION

Figure 2A:
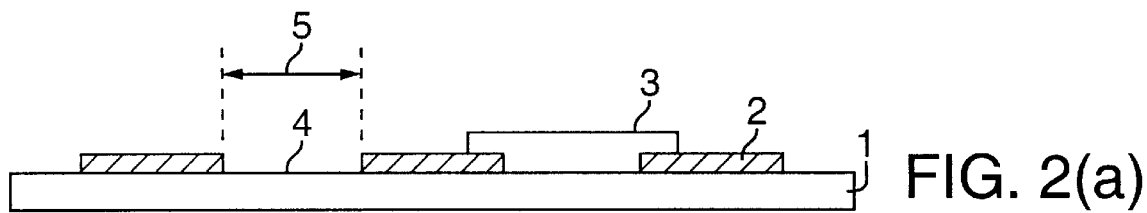
FIGS. 2(a), 2(b) and 2(c) show multiple mask patterns, according to another aspect of the invention, wherein a width between masking sections is reduced for mask patterns used to expose a multiple-exposure area.

FIG. 1 shows different mask patterns used according to one aspect of the present invention to distribute substantially the same average light-flux intensity to a multiple-exposure area as that distributed to a single-exposure area, even though the single- and multiple-exposure areas are exposed a different number of times. FIG. 1(a) represents a mask pattern used in an exposure of the single-exposure area on a photosensitive material. FIG. 1(b) represents a mask pattern used in a first exposure of a double-exposure area. FIG. 1(c) represents a mask pattern used in a second exposure of the double-exposure area.

Turning to FIG. 1(a), the mask pattern is formed using a mask substrate 1 with alternating masking sections 2 and light-permeable sections 4 situated on the surface of the mask substrate 1. The masking sections 2 are used for blocking illumination light, while the light-permeable sections 4 are used to transmit illumination light to the photosensitive material. The light-permeable sections 4 include apertures having a width 5 positioned between the masking sections 2. A phase-shift mask 3 may be used so that patterns with a sufficiently high degree of resolution can be formed. Phase-shifting portions 3 of the phase-shift mask are situated in the light-permeable section 4, between two masking sections 2.

The photosensitive material (i.e., resist) has an image response concentration ξ in accordance with the following equation (1):

$$\xi = \exp(-C \cdot I^m \cdot T) \tag{1}$$

wherein I is an intensity of incident light, T is an exposure time, C is a constant, and m is an index designating the linearity of the resist. With a resist having a photosensitive characteristic of m=1, such as found with a commonly used positive type of resist, the photosensitivity of the resist responds to the incident light intensity linearly. On the other hand, a resist having a photosensitive characteristic of m≠1 responds non-linearly to the intensity of the incident light. In the present invention, a two-photon resist may be used as the resist so that m is equal to 2 and its photosensitivity characteristic responds non-linearly to the intensity of incident light.

FIG. 1(a') shows the distribution of light-flux intensity formed after a single exposure in a single-exposure area of the photosensitive material using the mask pattern of FIG. 1(a). The actual light-flux intensity is denoted as Ie1 (x), which is explained further below, while the average effective intensity is shown at 6. Notably, a high light-flux intensity is present in relation to the light-permeable sections 4, while the masking sections 2 reduce or block the light-flux intensity.

FIG. 1(b) shows a mask pattern used in a first exposure of a multiple-exposure area of the photosensitive material. Like the mask pattern of FIG. 1(a), the FIG. 1(b) mask pattern includes a mask substrate 1 with alternating mask sections 2 and light-permeable sections 4 having a width 5. Additionally, phase-shift mask portions 3 are situated between adjacent mask sections. FIG. 1(b) depicts an additional feature not shown in FIG. 1(a). In the light-permeable sections 4, a plurality of spaced-apart, light-impermeable sections 7 are formed. These light-impermeable sections act to reduce the light-flux intensity per exposure distributed to the photosensitive material relative to the mask pattern of FIG. 1(a), where each light-permeable section is a continuous aperture.

FIG. 1(b') shows the distribution of light-flux intensity formed after a first exposure in a multiple-exposure area of the photosensitive material using the mask pattern of FIG. 1(b). The amplitude is noticeably lower in FIG. 1(b') than in FIG. 1(a') because of the light-impermeable sections 7.

FIG. 1(c) shows a mask pattern used in a second exposure of the multiple-exposure area. This mask pattern is virtually identical to the FIG. 1(b) mask pattern except the mask sections 2 are aligned to overlap with the light-permeable sections 4 of FIG. 1(b). Consequently, the distribution of light-flux intensity shown in FIG. 1(c') is phase shifted 180 degrees from that shown in FIG. 1(b').

FIG. 1(d') shows the distribution of light-flux intensity for the multiple-exposure area as a combination of FIGS. 1(b') and 1(c'). The distribution of light-flux intensity is denoted as Ie2(x), which is explained further below, while the average light-flux intensity is indicated at 8. The average light-flux intensity 8 is substantially equivalent or matched to the average light-flux intensity 6 in FIG. 1(a').

The intensity distribution $I_1(x)$ formed in the single-exposure area of the resist by the exposure using mask pattern shown in FIG. 1(a) and the effective intensity distribution $Ie_1(x)$ are expressed by the following equations (2) and (3), respectively.

$$I_1(x) = 1 + \cos(\pi x/R) \tag{2}$$

$$Ie_1(x) = I_1(x)^2 = 3/2 + 2\cos(\pi x/R) + \cos(2\pi x/R)/2 \tag{3}$$

wherein x is the location on the photosensitive material and R is the pitch of the pattern image in the single-exposure area.

The effective intensity distribution $Ie_2(x)$ shown in FIG. 1(d') comprises the sum of the effective intensity distribution shown in FIG. 1(c') and the effective intensity distribution shown in FIG. 1(b'). This effective intensity distribution $Ie_2(x)$ is expressed by equation (4) below.

$$Ie_2(x) = \alpha^2[Ie_1(x) + Ie_1(x - R/2)] \quad (4)$$

$$= 3\alpha^2 + \alpha^2 \cos(2\pi x/R)$$

wherein α is the transmissivity of the light-permeable section (aperture) of the mask pattern used in the exposure of the multiple-exposure area. In this case the multiple-exposure area is a double-exposure area.

The latent image response of the resist is dependent upon the effective illumination intensity on the resist. Thus, in order to form a pattern with matching line width precision in both the single-exposure area and the double-exposure area, the distribution of the average effective light-flux intensity of the single-exposure area is matched with the average effective light-flux intensity of the double-exposure area. In the FIG. 1 embodiment (i.e., double exposure), the transmittance α of the light-permeable section of the mask pattern used in the exposure of the double-exposure area is adjusted to $1/(2)^{1/2}$. To reduce the transmittance α, the impermeable section 7 is added for fine pitch.

By making the transmissivity of the light-permeable section 4 of the mask pattern used in the exposure of the double-exposure area smaller than the transmittance of the permeable section of the mask pattern used in the exposure of the single-exposure area, the average light-flux intensity of the single-exposure area after one exposure is matched to the distribution of the average light-flux intensity of the double-exposure area after two exposures. As a result, the line width precision of the pattern in the single-exposure area and the double-exposure area are matched.

Furthermore, in order to match the pattern line width with even greater precision in the single-exposure area and the double-exposure area, it is desirable to specify the transmittance α of the light-permeable section taking into account such factors as the development characteristics of the resist. Also, by adjusting the transmittance a of the light-permeable section of FIGS. 1(b) and 1(c) to $1/(3)^{1/2}$, the ratio of the line width of the pattern formed using the average light-flux intensity of the double-exposure area can be set to 1:2 in response to the line width of the pattern formed using the same illumination used in the single-exposure area.

Figure 2B:
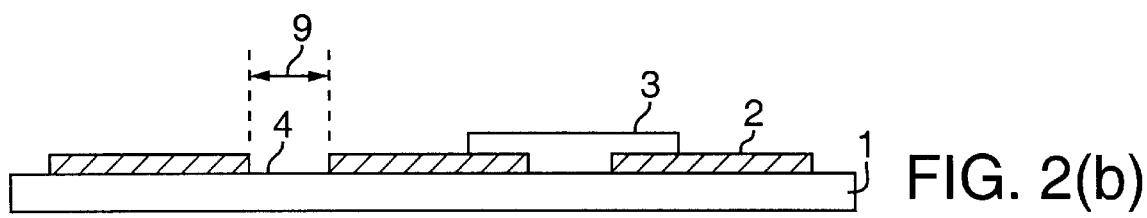
Figure 2C:
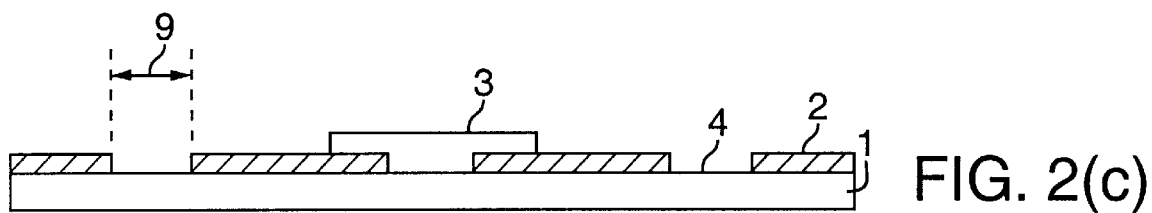

FIGS. 2(a)–2(b) show mask patterns according to a second embodiment of the present invention. FIG. 2(a) represents a mask pattern used in an exposure of the single-exposure area. FIG. 2(b) represents a mask pattern used in a first exposure of a double-exposure area. FIG. 2(c) represents a mask pattern used in a second exposure of the double-exposure area.

In FIG. 2(a), the width 5 of the light-permeable section 4 is the same width as shown in FIG. 1(a). In FIG. 2(b), however, the width 9 of the light-permeable section 4 is reduced. The effect of the reduced width 9 is to reduce the light-flux intensity per exposure to the double-exposure area. By reducing the width 9 by a proper amount, the average light-flux intensity of the single-exposure area after one exposure is substantially equal to the average light-flux intensity of the double-exposure area after two exposures. Because only the widths of the light-permeable sections have been changed, the production of the masks is easier than those shown in the FIG. 1 embodiment.

Figure 3:
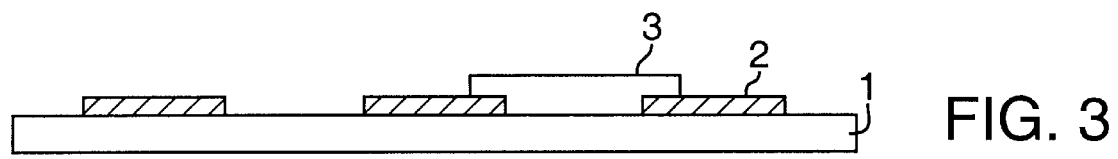
FIG. 3 shows a mask pattern according to another aspect of the present invention wherein masking sections are light-transmissive, to a limited extent, to allow an increased intensity of illumination-light flux to be projection-distributed to a single-exposure area.

FIG. 3 shows a mask pattern according to a third embodiment of this invention. The illustrated mask pattern is used to expose the single-exposure area. A masking section 2 is configured to admit some light, so that the distribution of light per exposure is increased relative to masks for the double-exposure area. By sufficiently increasing the light per exposure, the average light-flux intensity of the single-exposure area after one exposure and the average light-flux intensity of the double-exposure area after two exposures are substantially the same. This embodiment differs from the first two embodiments because only the mask pattern of FIG. 3 for the single-exposure area is modified. The mask patterns of the double-exposure area remain unchanged. This shows that either the mask pattern used in the exposure of the single-exposure area or the mask pattern used in the exposure of the double-exposure area can be modified.

Figure 4:
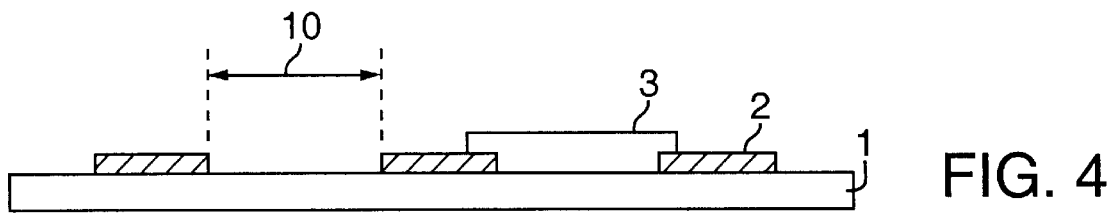
FIG. 4 shows a mask pattern according to another aspect of the present invention wherein the spacing between masking sections is increased to increase the intensity of illumination-light flux projection-distributed to a single-exposure area.

FIG. 4 shows a mask pattern according to a fourth embodiment of this invention for exposing the single-exposure area. As shown in FIG. 4, by broadening a width 10 of the light-permeable section 4, the distribution of light per exposure is increased for the single-exposure area. This allows the average light-flux intensity of the single-exposure area after one exposure and the double-exposure area after multiple exposures to be substantially the same. Like the third embodiment, only the mask pattern used in the exposure of the single-exposure area has been changed. Also, like the second embodiment, only the width of the light-permeable section has been changed, which is easier to produce than the mask patterns shown in the first or third embodiments.

Figure 5:
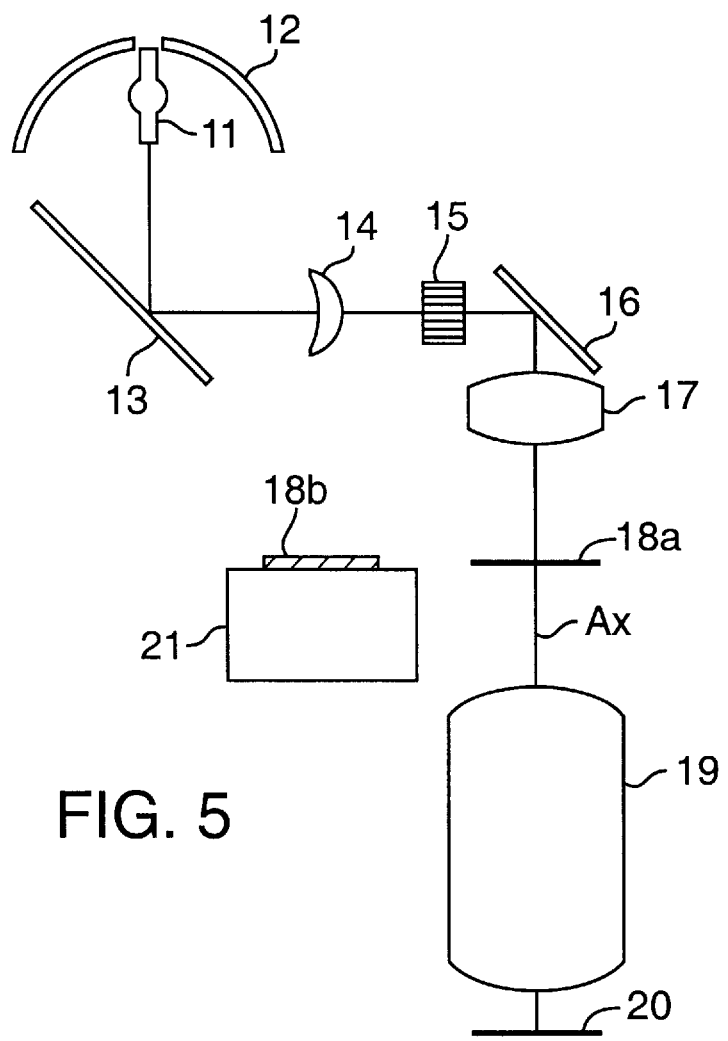
FIG. 5 schematically illustrates a projection-exposure device ("aligner") according to a preferred embodiment.

FIG. 5 shows a microlithography projection-exposure device ("aligner") according to the present invention. As shown in FIG. 5, the illumination optical flux from a light source 11 is condensed by an elliptical mirror 12 and guided into a collimator lens 14 by a mirror 13 before entering a fly-eye integrator 15 as nearly parallel illumination-light flux. The illumination-light flux passes through the fly-eye integrator 15 and is guided into a main condenser lens 17 by a mirror 16. The illumination-light flux nearly uniformly illuminates the mask 18a. A specified pattern defined on the surface of the mask 18a is projection-exposed, by a projection optical system 19, onto a substrate (e.g., a silicon wafer) 20 coated with a photosensitive material (resist).

Using the mask patterns of FIG. 1 as an example, the mask 18a comprises a mask pattern as shown in FIG. 1(a) for exposing the single-exposure areas. Additionally, the mask 18a comprises a portion with a mask pattern as shown in FIG. 1(b) for perform a first exposure of multiple-exposure areas. Using a mask loader 21, the mask 18a is removed and replaced with a new mask 18b. The mask 18b defines a mask pattern as shown in FIG. 1(c). After the position of the mask 18b has been determined relative to the projection optical system 19, a second projection exposure is performed. As a result, a fine pattern is formed with higher resolution than the resolution limit of the projection optical system 19.

Having illustrated and described the principles of the invention in multiple embodiments, it should be apparent to those skilled in the art that the embodiments can be modified in arrangement and detail without departing from such principles.

For example, although a one-dimensional pattern formed on a phase-shift mask is used in the first through fourth embodiments, conventional masks or two-dimensional patterns may be used.

Furthermore, although a two-photon absorption resist is used for the resist, other resists having non-linear photosensitivity characteristics may be used.

Still further, although a double exposure is used in the foregoing description to produce a pattern on the substrate having a resolution greater than the resolution of the projecting optical system, other numbers of exposures may be used, such as three or more exposures.

Yet still further, high-resolution patterns can be formed with this invention using annular illumination, irregular illumination or other oblique incident illumination.

Still further, although in FIG. 5, the first mask 18a is replaced with the second mask 18b after the first exposure by the action of the mask loader 21, the second exposure can be performed by moving the mask 18a of a specific amount perpendicular to the optical axis Ax of the projection optical system 19. In this case, it would be necessary to shade or mask light corresponding to the pattern of the first mask 18a used in the exposure of the first exposure area. Alternatively, when using the same mask pattern in multiple exposures, is the substrate 20 may be moved a specific amount perpendicular to the optical axis Ax of the projection optical system 19 for each exposure instead of moving the mask 18a with respect to the projection optical system 19.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A mask for microlithographically projecting a pattern onto a photosensitive substrate comprising single- and multiple-exposure areas, the mask comprising:
   (a) a first mask pattern for exposing the single-exposure areas of the photosensitive substrate;
   (b) at least a second and a third mask pattern for exposing the multiple-exposure areas of the photosensitive substrate; and
   (c) each of the mask patterns for exposing the multiple-exposure areas transmitting to the photosensitive substrate a lower illumination-light-flux intensity per exposure than the first mask pattern so that an average illumination-light-flux intensity transmitted to the single-exposure areas is substantially equal to an average illumination-light-flux intensity transmitted to the multiple-exposure areas after the multiple exposures.

2. The mask of claim 1, wherein each of the first mask pattern and the mask patterns for exposing the multiple-exposure areas comprises alternating light-transmissive sections and light-blocking sections, the light-blocking sections blocking transmission of illumination light to the photosensitive substrate, each of the light-transmissive sections defining at least one aperture for allowing illumination light to be distributed to the photosensitive substrate.

3. The mask of claim 2, wherein the first mask pattern defines apertures situated between the light-blocking sections.

4. The mask of claim 2, wherein each aperture in the mask patterns for exposing the multiple-exposure areas comprises spaced-apart, light-impermeable sections for reducing the distribution of illumination-light-flux intensity per exposure to the multiple-exposure areas.

5. The mask of claim 2, wherein the apertures of the first mask pattern have a first width and the apertures of the mask patterns for exposing the multiple-exposure areas each have at least a second width that is less than the first width.

6. The mask of claim 2, wherein the light-blocking sections of the first mask pattern are at least partially light transmissive and the light-blocking sections of the mask patterns for exposing the multiple-exposure areas are light-impermeable.

7. A method of microlithographically projecting a pattern onto a photosensitive substrate comprising single- and multiple-exposure areas, the method comprising the steps of:
   (a) exposing the single-exposure areas of the photosensitive substrate with an illumination-light flux transmitted through a first mask pattern;
   (b) exposing the multiple-exposure areas of the photosensitive substrate a first time with an illumination-light flux transmitted through a second mask pattern; and
   (c) exposing the multiple-exposure areas of the photosensitive substrate a second time with an illumination-light flux transmitted through a third mask pattern, wherein an average intensity of the illumination-light flux distributed to the single-exposure areas using the first mask pattern is substantially equal to an average intensity of the illumination-light flux distributed to the multiple-exposure areas using at least the second and third mask patterns.

8. The method of claim 7, wherein, in steps (b) and (c), the multiple-exposure areas are exposed using a lower intensity of illumination-light flux per exposure than used during exposure of the single-exposure areas.

9. The method of claim 8, wherein the first and second mask patterns are defined on a first mask and the third mask pattern is defined on a second mask.

10. The method of claim 9, further comprising
    making a first exposure on the single-exposure areas and the multiple-exposure areas using the first and second mask patterns, respectively;
    replacing the first mask with the second mask; and
    making a second exposure of the multiple-exposure area using the second mask.

11. The method of claim 7, further comprising exposing the multiple-exposure areas a third time and adjusting the intensity of illumination-light flux distributed to the multiple-exposure areas per exposure so that the average intensity of illumination light flux distributed to the single-exposure areas, after one exposure, is substantially equivalent to the average intensity of illumination-light flux distributed to the multiple-exposure areas after three exposures.

12. A microlithographic projection-exposure apparatus, comprising:
    (a) an illumination-optical system for producing an illumination-light flux;
    (b) a first mask comprising a first mask pattern for projection, by one exposure, onto single-exposure areas of a photosensitive substrate and a second mask pattern for projection, by a predetermined number of multiple exposures, onto multiple-exposure areas of the substrate, the first mask being positionable downstream of the illumination-optical system for illumination by the illumination-light flux;
    (c) a second mask comprising a third mask pattern for projection, by a predetermined number of multiple exposures, onto the multiple-exposure areas of the substrate, the second mask being positionable downstream of the illumination-optical system for illumination by the illumination-light flux when the first mask is not being illuminated with the illumination-light flux;
    (d) a projection-optical system for receiving illumination light transmitted through the first or second mask from the illumination-optical system and projection-distributing the illumination light to the substrate, the second and third mask patterns being configured relative to the first mask pattern so as to produce, after a total predetermined number of multiple exposures of the multiple-exposure areas of the substrate, a total average intensity of illumination light on the multiple-exposure areas that is substantially equal to a total average intensity of illumination light produced by the one exposure of the first mask pattern on the single-exposure areas of the substrate.

13. The apparatus of claim 12, wherein each of the second and third mask patterns comprise light-blocking sections and light-transmissive sections, the light-transmissive sections of the third mask pattern being positioned so as to overlap the light-blocking sections of the second mask pattern.

14. The apparatus of claim 12, further comprising a mask loader for replacing the first mask with the second mask.

15. The apparatus of claim 12, further comprising an illumination-light source situated upstream of the illumination-optical system.

* * * * *

UNITED STATES PATENT AND TRADEMARK OFFICE
CERTIFICATE OF CORRECTION

PATENT NO. : 5,851,707
DATED : December 22, 1998
INVENTOR(S) : SHIBUYA ET AL.

It is certified that error appears in the above-indentified patent and that said Letters Patent is hereby corrected as shown below:

Column 5, line 36, "transmittance a" should be --transmittance $\alpha$--.

Column 7, line 9, delete "is".

Signed and Sealed this

Twenty-sixth Day of October, 1999

Attest:

Attesting Officer

Q. TODD DICKINSON

Acting Commissioner of Patents and Trademarks